United States Patent
Gronwald et al.

(10) Patent No.: US 8,319,499 B2
(45) Date of Patent: Nov. 27, 2012

(54) COATED MOTOR VEHICLE BATTERY SENSOR ELEMENT AND METHOD FOR PRODUCING A MOTOR VEHICLE BATTERY SENSOR ELEMENT

(75) Inventors: Frank Gronwald, Bedburg (DE); Franz-Josef Lietz, Oberhausen-Lirich (DE)

(73) Assignee: Auto Kabel Managementgesellschaft mbH, Hausen i.W. (DE)

( * ) Notice: Subject to any disclaimer, the term of this patent is extended or adjusted under 35 U.S.C. 154(b) by 314 days.

(21) Appl. No.: 12/668,415

(22) PCT Filed: Jan. 18, 2008

(86) PCT No.: PCT/EP2008/050572
§ 371 (c)(1), (2), (4) Date: Feb. 5, 2010

(87) PCT Pub. No.: WO2009/010313
PCT Pub. Date: Jan. 22, 2009

(65) Prior Publication Data
US 2010/0201369 A1    Aug. 12, 2010

(30) Foreign Application Priority Data

Jul. 13, 2007 (DE) .......................... 10 2007 033 182
Sep. 24, 2007 (WO) ................. PCT/EP2007/060104

(51) Int. Cl.
*G01N 27/416* (2006.01)
*G01L 1/00* (2006.01)
*H02H 5/04* (2006.01)
*H02H 3/20* (2006.01)

(52) U.S. Cl. ............ 324/430; 73/776; 361/26; 361/91.2

(58) Field of Classification Search .................. 324/430; 361/26, 34, 88, 91.2, 93.8, 103, 163; 73/776
See application file for complete search history.

(56) References Cited

U.S. PATENT DOCUMENTS

| 4,243,885 A * | 1/1981 | Agouridis et al. ....... 250/370.07 |
| 4,253,334 A * | 3/1981 | Hakansson et al. ........... 374/170 |
| 5,008,736 A * | 4/1991 | Davies et al. ................. 361/103 |
| 6,828,362 B1 * | 12/2004 | Lee et al. ......................... 524/47 |
| 7,368,827 B2 * | 5/2008 | Kulkarni et al. ................ 290/52 |
| 2004/0169969 A1 * | 9/2004 | Takeda ............................. 361/42 |

FOREIGN PATENT DOCUMENTS

| CN | 1808147 | 7/2006 |
| DE | 102004040575 A1 | 8/2004 |
| DE | 102004007851 A1 | 9/2005 |

(Continued)

OTHER PUBLICATIONS

European Patent Office, International Search Report, PCT/EP2008/05072, May 9, 2008.

(Continued)

*Primary Examiner* — M'Baye Diao
(74) *Attorney, Agent, or Firm* — Sunstein Kann Murphy & Timbers LLP

(57) ABSTRACT

The invention relates to a motor vehicle battery sensor element comprising a resistor element 2 and at least two spatially separated electric contacts 16 positioned on the resistor element 2. To increase the measuring accuracy and to reduce the temperature variance, it is proposed that the resistor element 2 along with the electric contacts 16 is coated with a metal coating 8.

21 Claims, 3 Drawing Sheets

FOREIGN PATENT DOCUMENTS

Figure 1A:
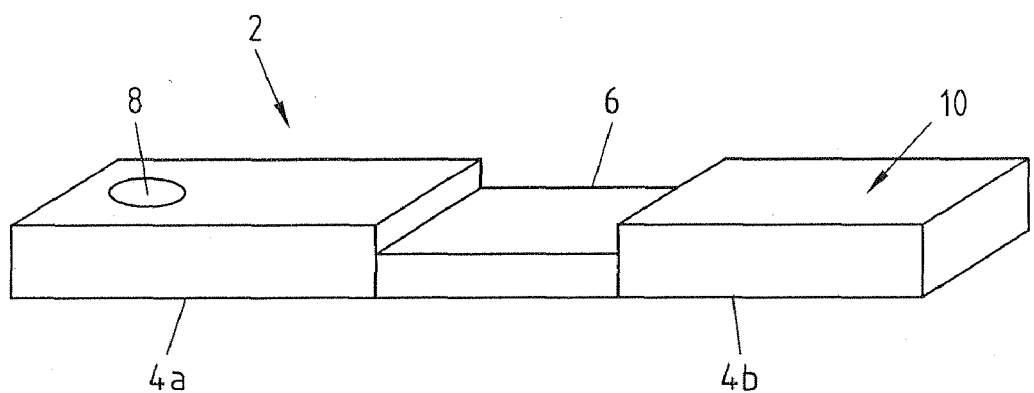

| | | |
|---|---|---|
| DE | 102004049153 A1 | 4/2006 |
| DE | 102005019569 A1 | 11/2006 |
| EP | 0193854 A1 | 2/1986 |
| EP | 1028436 A1 | 8/2000 |
| EP | 1030185 A2 | 8/2000 |
| EP | 0990167 B1 | 6/2006 |

OTHER PUBLICATIONS

The State Intellectual Property Office of the People's Republic of China, Office Action, Application No. 200880024424.4, dated Feb. 13, 2012, 7 pages.

* cited by examiner

COATED MOTOR VEHICLE BATTERY SENSOR ELEMENT AND METHOD FOR PRODUCING A MOTOR VEHICLE BATTERY SENSOR ELEMENT

The application relates to a motor vehicle battery sensor element with a resistor element and at least two spatially separated contacts positioned on the resistor element. The invention also relates to a method for producing such a motor vehicle battery sensor element.

Present-day motor vehicles have an ever-increasing number of electrical consumers. Apart from the essential engine functions which are electrically powered, such as for example the starter motor, motor vehicles contain a large number of comfort consumers, such as for example air conditioning, navigation system, onboard computer, maintenance electronics and so on. The large number of comfort consumers leads to an increased load on the motor vehicle battery. Even when the motor vehicle is at a standstill, power is being demanded from the battery. This means that the battery is no longer used just for the original tasks of powering the starter motor with starter current, but provides all the electronics in the motor vehicle with energy. Due to the discharging of the battery when the vehicle is at a standstill, it may be that there is insufficient starter current available for starting. This is something that must be avoided.

For the above reasons it is necessary to be able to reliably determine the state of the battery. To this end in the past a variety of motor vehicle battery sensors have been proposed. These motor vehicle battery sensors are preferably positioned directly on the battery terminals.

Thus, for example, from EP 0 990 167 a battery terminal is known, which via a resistor (shunt), apart from the current in the power conductors of the battery, also measures the voltage and/or temperature and for example using these values assesses the state of the battery. In order to assess the state of the battery it is necessary to be able to precisely measure the voltage dropping via the shunt. The assessment is highly dependent upon the quality of the voltage tap via the shunt. Thus an accurate measurement is determined by how the voltage taps and the measurement electronics are positioned on the shunt.

With the resistor elements known today it is necessary to position a resistance piece between two connection pieces. So these days, for example, a CuMn12Ni-alloy (Manganin) is used as the resistance piece. The Manganin is positioned between two connection pieces in non-ferrous metal, for example copper. During production the connection pieces, which for example have a flat design, are welded to the resistance piece with a flat design by means of electron beam welding. Here the flat part in Manganin can be thinner than the flat parts of the connection pieces, so that the resistance piece forms an indentation in the surface of the resistor element. On the cooper connection pieces are positioned connection supports, which are likewise in copper. An integrated circuit is soldered to the connection supports, with which at least the physical measures of current, voltage and/or temperature of the resistance piece can be evaluated.

It has been discovered, however, that thermoelectric potential results in the transition from copper to Manganin. This thermoelectric potential leads to interference with the measurement results of the measurement electronics. The Seebeck effect is for example responsible for the thermoelectric potential. Therefrom, a current results within a conductor if there is a heat flow. In the event that the connection supports are positioned directly on the Manganin, a thermoelectric potential results which influences the measurement result in a temperature variant manner. The thermoelectric potential is also known as the thermoelectric force and is caused by a temperature-dependent flow of electrons. The thermoelectric potential can be determined by:

$$U = (K_a - K_b) \cdot (T_1 - T_2)$$

where U: voltage, K: K-value of the material, $T_1$; $T_2$: temperature of the materials at the point of connection. Copper has a K-value of 0.7 mV/100K.

The disadvantages outlined above pose the problem of providing a resistor element for a motor vehicle battery sensor which is essentially temperature invariant.

The problem derived and demonstrated above from the prior art is solved in that the resistor element, along with the electrical contacts, is coated with a metal coating.

It has been discovered that by a seamless metal coating of the resistor element together with the electrical contacts the effect of the thermoelectric potential between the resistor element and the electrical contacts on the measurement result can be reduced, preferably eliminated.

If a thermoelectric potential does arise between the contacts and the resistor element, this can be short-circuited by the coating. The electrical contacts can for example, be positioned directly on the shunt, resulting in a temperature-dependent thermoelectric potential between the shunt and the contacts. To compensate for this contact voltage the metal coating is provided. The metal coating is able to electrically short-circuit the thermoelectric potential and thus compensate for its effect on the measurement result. The electrical tapping of the sensor takes place via the contacts. At the electrical tap the thermoelectric potential between the resistor and the electrical contacts is essentially compensated.

The metal coating represents in the electrical equivalent circuit diagram a resistor positioned in parallel to the measurement electronics, which resistor lies parallel to the measuring resistor element. The effect of the resistance of the metal coating is, for example, in the range between 1 and 3% of the total resistance of the measuring resistor.

It has become apparent that a coating in tin (SN) has the necessary characteristics. Through the metal coating the surface protection of the contacts and of the resistor element is also achieved. It is known that electrical contacts can oxidise and thus when tapping via the electrical contacts an increased contact resistance results. By using a tin coating oxidation of the electrical contacts can be lessened.

The thermoelectric potential between the electrical contacts and the resistor element or between the connection pieces and resistance piece of the resistor elements can be between 0.1 μV/K and 10 μV/K, preferably between 0.4 μV/K and 0.8 μV/k. This is the case, for example, when Manganin is used as the resistance piece of the resistor element and copper as the electrical contact or connection piece.

A layer thickness of the coating of between 1 μm and 10 μm, preferably of between 5 μm and 8 μm, is preferred. For a distance between the electrical contacts of approximately 10 mm, such a coating leads to a resistance of the coating between the electrical contacts of approximately 8,000 μΩ. Where the resistance of the resistance piece, for example of the shunt, is 110 μΩ, from the parallel connection of these two resistances a total resistance of 108.6 μΩ results.

In order to be able to reduce the effects of temperature on the measurement result, it is proposed that the temperature-dependent resistance of the coating is essentially compensated by the temperature-dependent resistance of the resistor element. Where tin is used, for example, the temperature-dependent change in the resistance (temperature coefficient) of the coating can distort the measurement result. With a precision measuring shunt, however, this is a disadvantage. Therefore through a suitable choice of resistor element the temperature-dependent change in the resistance of the coating can be counteracted. For example, the resistor element can be selected so that the total resistance from the connection in parallel between the coating and the resistor element is essentially temperature-independent.

For example, the temperature coefficient $\alpha_{20}$ of the coating can be in the range $1 \cdot 10^{-3}$ to $9 \cdot 10^{-3}$ 1/K, preferably $6.10^{-3}$ 1/K. The temperature coefficient $\alpha_{20}$ of the resistor element can for example be the inverse of this. The temperature coefficient $\alpha_{20}$ of the resistor element can also be $10 \cdot 10^{-6}$ 1/K.

The electrical contacts can be positioned directly on a resistance piece, for example made from Manganin, of the resistor element. In the event of temperature changes the resistances vary as a function of the temperature coefficients according to:

$$R(T)=R(T_0)(1+\alpha_{T0}(T-T_0))$$

where R: resistance, T: temperature, $T_0$: starting temperature, preferably 20° C., $\alpha_{To}$: temperature coefficient at starting temperature.

According to an advantageous exemplary embodiment the electrical contacts are made from a non-ferrous metal, for example copper. The copper contacts allow good contacting with measurement electronics for measurement of the battery current and/or the temperature.

According to an advantageous exemplary embodiment the resistor element can be made from two flat parts firmly bonded together. For example, a resistance piece can be formed from Manganin and a connection piece from copper.

According to an advantageous embodiment the first flat part is a resistance piece in the form of a measuring resistor and a second flat part is a connection piece made from non-ferrous metal.

By placing the contacts flat on the surface of the resistor element the contacts serve directly as spacers for an integrated circuit, so that contact between integrated circuit and resistor element beyond the contacts can be avoided. Because the resistor element is designed as a flat part, the contacts can be positioned flat along the resistor element.

Preference is for the use of the materials NiCu30Fe, CuMn12Ni, CuNi30Mn, NiFe30, CuNi23Mn, CuMn7Sn, CuNi15, CuNi10, CuMn3, CuNi6, Ni99.6, Ni99.4Fe, Ni99.98, CuN12, CuNi1, E-Cu57 or W. These alloys or materials are particularly well-suited as the resistor element, since they allow a precise determination of the voltage and of the current.

In order to be able to directly measure the temperature of the battery, it is proposed that the resistor element is connected with a battery pole clip by material closure. In this case the battery pole clip can be directly connected to a battery pole and the temperature of the battery pole is transmitted to the resistor element.

In order to be able to supply the electrical consumers of the motor vehicle with the battery current, it is proposed that the resistor element is firmly bonded with a power conductor leading to the consumer.

According to an advantageous embodiment it is proposed that the contacts are in the form of flat or round electrical conductors positioned flat on the surface of the resistor element. For example, it is possible to position a round wire along the surface of the flat part and connect this electrically to the resistor element. If the contacts are located at a defined distance from one another, then it is possible via the voltage measured between the contacts to determine the current flow in the resistor element. Through a large contact area between the contacts and the resistor element it is possible to guarantee a precise temperature sensing in an integrated circuit connected to the contacts. It is also possible for flat profiles acting as conductors to be brought into contact with the resistor element in order to form the contacts.

It is also proposed that the contacts are positioned essentially orthogonally to the direction of the current in the resistor element on the surface of the resistor element. The flat positioning of the contacts on the resistor element can essentially take place along a line. A flat positioning of the contacts on the resistor element, unlike a point by point positioning, apart from a low contact resistance and good thermal conductivity, also provides a support function for an integrated circuit positioned on the contacts.

In order to create a good electrical contact between resistor element and contact, it is proposed that the contacts are connected with the resistor element by material closure (firmly bonded, material locking, material fit).

Such a material closure can be created, for example, by means of ultrasonic welding. Ultrasonic welding avoids spattering of material on the resistor element and thereby possibly distorting the measurement results. Good electrical contacting and high mechanical load-bearing capacity of the contacts for an integrated circuit are achieved by the contacts essentially being connected flat with the resistor element along their direction of extension.

It is not necessary for the contacts laying flat on the flat part to be contacted with the resistor element along the entire contact surface. It is also possible for the contacts to be connected with the resistor elements only intermittently by material closure.

The largest possible contact area between contacts and resistor elements is guaranteed by the contacts being positioned on the broad surface of the resistor element in the form of a flat part.

A particularly easy contacting of an integrated circuit with the contacts is guaranteed by the contacts being bent at both ends so that contact pins protrude essentially orthogonally from the surface plane of the resistor element. For example, it is possible, during manufacture, to allow the contacts to protrude beyond the edges of the resistor element. In this way it is possible, for example, to extend the contacts, which may for example be in the form of wires, so that their length is slightly greater than the width of the resistor element. After material bonding with the resistor element the ends of the wires stick out beyond the edges of the resistor. In a further production stage the resistor element connected to the contacts can for example be pushed into a mould which presses out the parts of the contacts extending beyond the edges from the plane of the surface of the resistor element. The contact pins formed in this way protrude from the plane of the resistor element and are particularly well-suited for electrical contacting with an integrated circuit.

The contacts serve for contacting with an integrated circuit, so that with the help of the integrated circuit at least the electrical voltage between the contacts can be assessed.

Through the flat positioning of the contacts on the resistor element the contacts form a natural spacer. An integrated circuit positioned on the contact pins is protected by the contacts from mechanical contacting with the resistor element. In the area of the contacts the integrated circuit can be formed in such a way that the side turned towards the contacts is free of solder points, so that only the board of the integrated circuit rests on the contacts and thus an electrical contacting with elements of the integrated circuit is avoided.

The electrical contacts preferably have a clearance of 1 mm-50 mm, preferably 5-10 mm. This allows good determination of the battery current.

It is also possible for the resistor element to be formed from at least two electrical connection pieces and one resistance piece. The electrical connection pieces can for example be made from a non-ferrous metal, for example copper or aluminium or an alloy thereof. The positioning of connection pieces may make it easier to make available an electrical interface with the power conductor of the vehicle electrical system, since with the help of the connection pieces a cable lug or another receptacle for the power conductor can be fashioned.

According to an advantageous embodiment, the contacts can be positioned either in the area of the resistance piece itself, on the transitions between the resistance piece and the connection pieces or on the connection pieces.

A beneficial production of the resistor element is guaranteed by the resistor element being in the form of flat parts punched or cut from bars. If the resistor elements are produced from bars, then tempering (destressing) is unnecessary, because otherwise if the material of the resistor elements were unwound from a coil, tensions would result in the resistor element.

In the event of the material of the resistor element being processed from a coil, according to an advantageous embodiment it is proposed that the resistor element is formed by a flat part that is initially unwound from a coil, then punched or cut and finally tempered.

A further subject matter of the application is a method for producing such a motor vehicle battery sensor element.

The method comprises the steps of positioning two spatially separated electrical contacts on a resistor element. The electrical contacts are also electrically connected to the resistor element. Finally, the electrical contacts are coated with metal together with the resistor element. The metal coating can for example be tin.

Figure 1B:
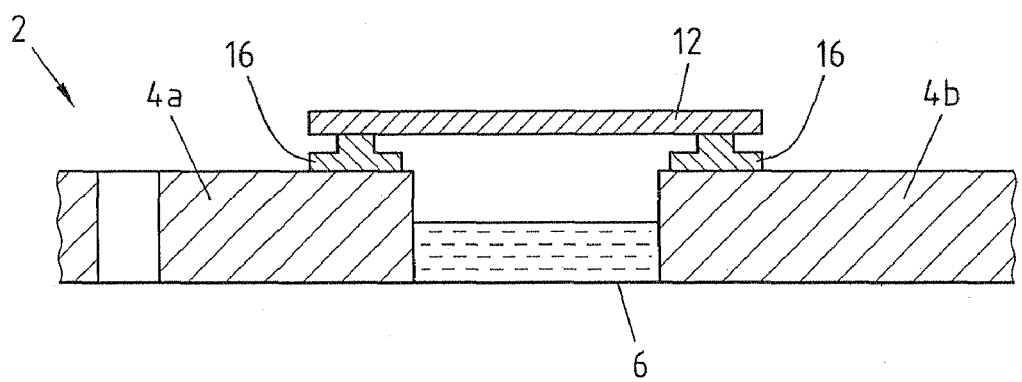
Figure 2:
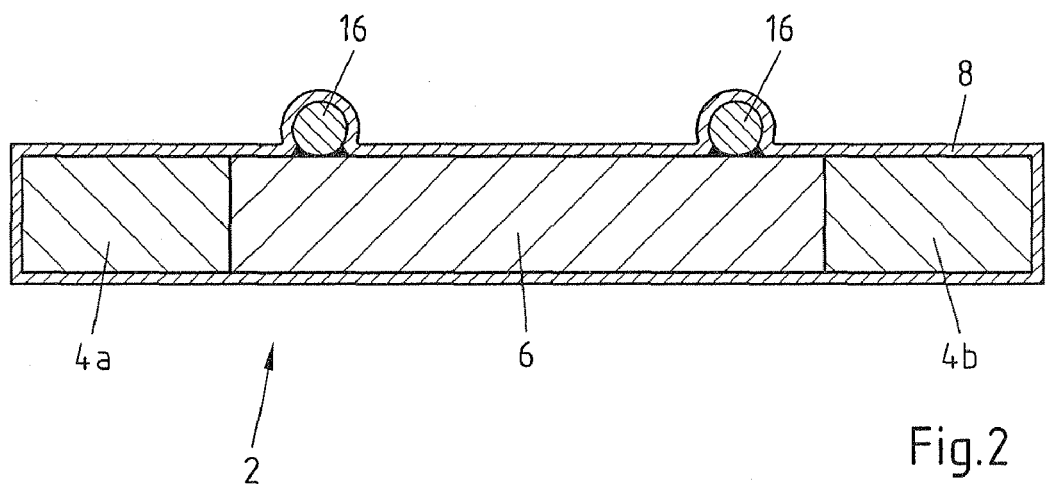
Figure 3:
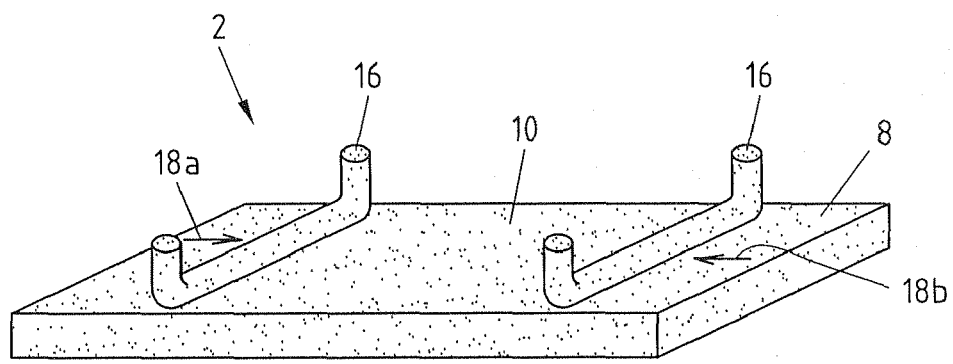
Figure 4:
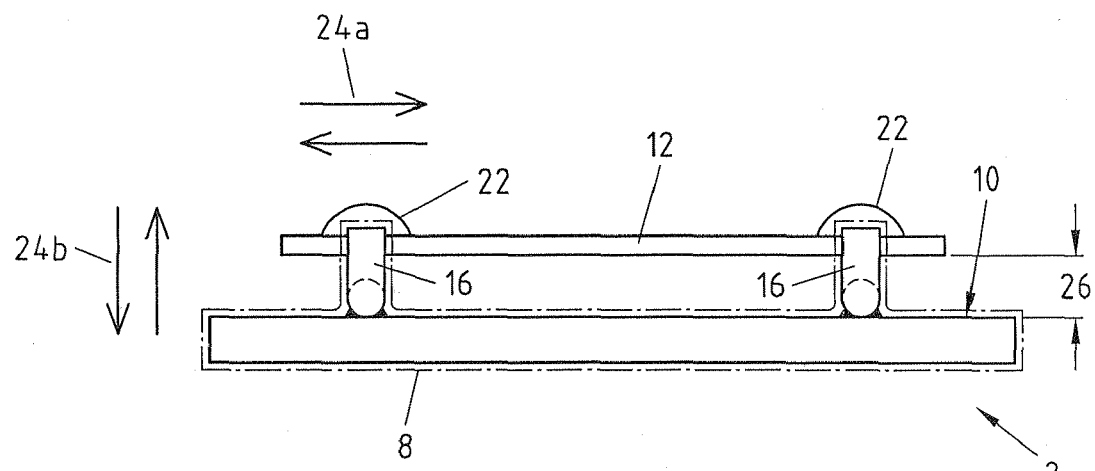
Figure 5:
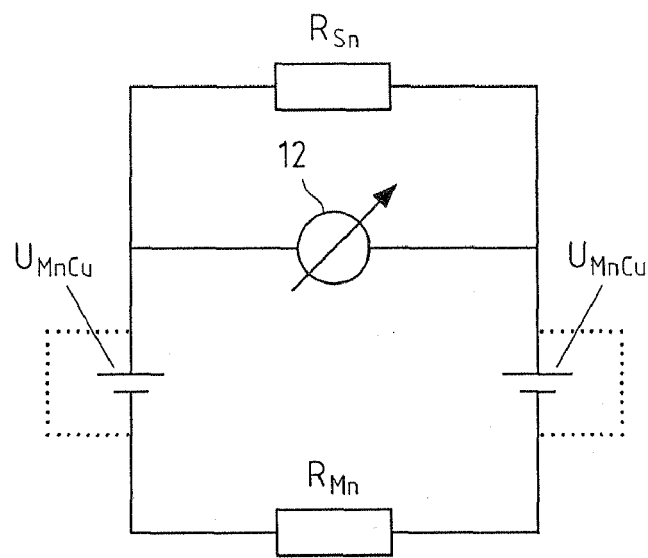
Figure 6:
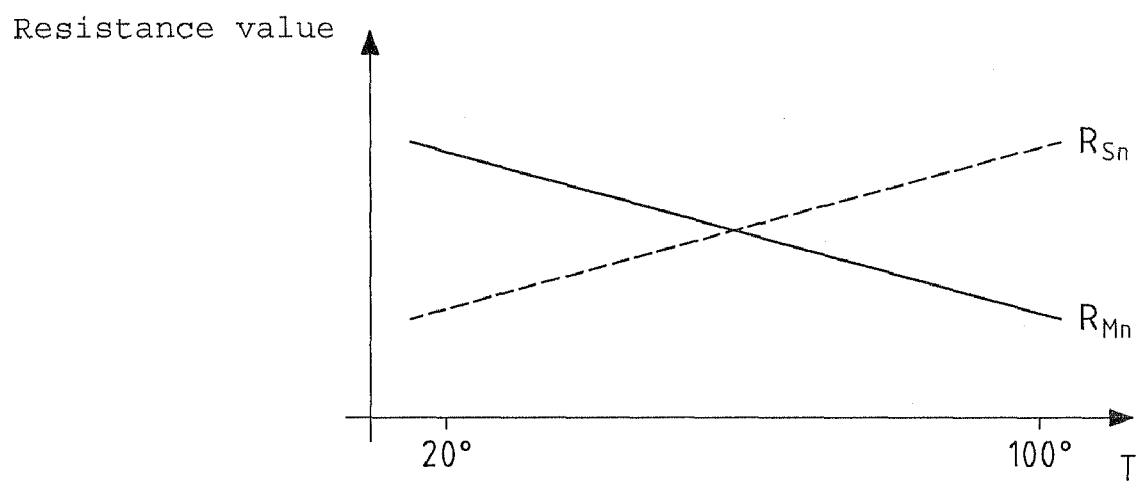

In the following the subject matter of the application is explained further using a drawing illustrating embodiments. The drawing shows as follows:

FIG. 1a a view of a conventional resistor element.
FIG. 1b a cutaway view of a conventional resistor element.
FIG. 2 a cutaway view of a resistor element according to the application.
FIG. 3 a top view of a resistor element according to the application.
FIG. 4 a cutaway view of a resistor element with an integrated circuit.
FIG. 5 an electrical equivalent circuit diagram of an arrangement according to FIG. 4.
FIG. 6 a schematised shape of the resistances as a function of temperature.

FIG. 1 shows a resistor element 2 with two connection pieces 4a, 4b and a resistance piece 6. The connection pieces 4a, 4b can for example be made from copper or alloys thereof. The resistance piece 6 can be made from a resistive material, for example Manganin, Tungsten, Zeranin or similar. Between the connection pieces 4a, 4b and the resistance piece 6 there is a material closure. The resistance piece 6 is formed in such a way that with the surface of the connection pieces 4a, 4b it creates a step. This can take place, for example, by a resistance piece 6, having a smaller thickness than the connection pieces 4a, 4b, being materially connected with connection pieces 4a, 4b. The connection pieces 4a, 4b can have recesses 8 for power conductors. The connection pieces 4a, 4b can be formed in such a way that they form a battery clip and allow a connection to a power conductor in a motor vehicle.

The step, formed by the resistance piece 6, in the surface 10 of the resistor element 2 is used, as shown in FIG. 1b, in order to guarantee sufficient clearance between an integrated circuit 12 and the resistance piece 6. The integrated circuit 12, by means of contacts, as shown in FIG. 1b, is electrically contacted with the connection pieces 4a, 4b. The contacts 16 are spot positioned on the surface 10 of the resistor element 2. Via the contacts 16 the voltage dropping across the resistance piece 6 can be measured. The contacts 16 also allow picking up of the temperature of the connection pieces 4a, 4b, which along with other physical variables is evaluated in the integrated circuit 12.

At the electrical contacts between the connection pieces 4a, 4b and the resistance piece 6 a thermoelectric potential results, which affects the voltage tapped via the contacts 16. Via the contacts 16, by means of the integrated circuit 12, the battery current flowing along the connection piece 4a, the resistance piece 6 and the connection piece 4b, is to be measured. This battery current causes a drop in voltage across the resistance piece 6, which is measured by the integrated circuit 12. By means of the thermoelectric potential resulting at the contacts between connection pieces 4a, 4b and resistance piece 6 apart from the voltage actually caused by the battery current in resistance piece 6 a further voltage is measured. The thermoelectric potential is temperature variant, however, so that at one and the same battery current but at different temperatures differing voltages will be measured in the integrated circuit 12. This leads to a distorted measurement result. Since, as shown previously, the measurement of the battery current plays a significant role in the operation of a motor vehicle, inaccuracies in the measurement result caused by thermoelectric potential can lead to malfunctions.

FIG. 2 shows a cutaway view of a resistor element 2, in which the previously mentioned problems do not arise. FIG. 2 shows connection pieces 4a, 4b, which are materially connected with the resistance piece 6. It should be pointed out that the use of the connection pieces 4 is purely for illustration purposes. A resistor element can also be formed simply from the resistance piece 6 or the resistance piece 6 and a connection piece 4. The electrical contacts 16 are positioned on the resistance piece 6. In the embodiment shown the connection pieces 4a, 4b are made from copper and the contact elements 16 are likewise made from copper. The resistance piece 6 is in the form of a shunt and for example can be made from Manganin. Between copper and Manganin a thermoelectric voltage results because of the differing K-values. This means that as the temperature changes the contact voltage between the connection pieces 4a, 4b and the resistance piece 6 or the resistance piece 6 and the contact elements 16 changes. At constant current through the resistance piece 6 via the contact elements 16 a changed voltage is measured as the temperature varies. In order to balance this temperature variance, it is proposed that a metal coating 8, which for example can be made from tin, is provided. The metal coating 8 encloses the resistor element 2 and at the same time the contact elements 16, with no seam. Through a suitable coating 8, the thermoelectric voltage of the transition from resistance piece 6 to the contact elements 16 or connection pieces 4 can essentially be short-circuited.

FIG. 3 shows a resistor element 2 according to an exemplary embodiment. It can be seen that the contacts 16 are positioned on the surface 10 of the resistor element 2, which according to the exemplary embodiment shown is in the form of a single resistance piece 6. Arrows 18 indicate the two possible directions of flow of the current in the resistor element 2. The current flows through the element 2 in the direction of the arrow 18a or in the direction of the arrow 18b. It can be seen that the contacts 16 positioned flat on the resistor element 2 are positioned orthogonally to the direction of flow of the current on the surface 10 of the resistor element 2. The contacts 16 are preferably applied using ultrasound welding to the surface 10 of the resistor element 2. The contacts 16 are preferably in the form of wires, but can also be in the form of shaped conductors with a rectangular or square cross-section. As can be seen, the contacts 16 are preferably flush with the edges of the resistor element 2. The contacts 16 are positioned on the surface 10, which is the broad surface of the resistor element 2. Along their direction of extension the contacts 16 are connected to the surface 10 of the resistor element. Via the contacts 16 an integrated circuit 12 can be connected to the resistor element 2.

A particularly good contacting of an integrated circuit 12 with the resistor element 2 is for example then possible if the contacts 16, as shown in FIG. 3, are bent at the edges of the resistor element 2 so that the ends of the contacts 16 protrude from the plane of the surface 10 of the resistor element 2.

From FIG. 3 it can likewise be seen that the entire resistor element along with the contacts 16 is coated with the coating 8. The coating 8 ensures that temperature changes have little, if any, effect on the battery current measurement result.

FIG. 4 shows a side view of a resistor element 2 with an integrated circuit 12. The resistor element 2 is contacted via the contacts 16 with the integrated circuit 12. The contacts 16 are connected to the integrated circuit 12 via solder points 22. The ends of the contacts 16 are bent, so that contact pins result via which the integrated circuit 12 is electrically connected to the resistor element 2. Because the contact pins of the contacts 16 protrude from the plane 10 of the resistor element 2, forces 24, acting on the integrated circuit 12 or the resistor element 2, can be balanced between resistor element 2 and integrated circuit 12. The contact pins thus serve as spring elements, able to absorb forces. As can be seen, the distance 26 between the integrated circuit 12 and the resistor element 2 is determined by the diameter of the wires of the contacts 16. The wires of the contacts 16 thus serve as spacers between resistor element 2 and integrated circuit 12.

The contacting of the integrated circuit 12 via the solder points 22 according to the advantageous embodiment does not have any voltage equivalent of thermal energy. The solder points 22 are preferably in the form of tin, as is the coating 8 on the surface 10 of the resistor element 2. The coating 8 is likewise provided on the contacts 16, so that the solder points 22 are positioned on a tinned surface. During measurement of the current through the resistor element 2 a voltage is tapped between the contacts 16. This voltage is the result of the current through the resistor element 2 and the resistance between the contacts 16 of the resistor element 2. Conventionally the resistance is in the range 50 to 500 μΩ, preferably 110 μΩ. At the transition between the resistance piece 2 and the contacts 16 a thermoelectric potential results. In order to suppress this thermoelectric potential, the coating 8 is provided. Through the coating 8 the thermoelectric voltage between the contacts 16 and the resistor element 2 is essentially short-circuited.

FIG. 5 shows an electrical equivalent circuit diagram of a circuit arrangement according to FIG. 4. A measuring resistor $R_{Mn}$ is shown, which is the resistance of the resistor element 2 between the contacts 16. Further, a resistance $R_{Sn}$ is shown, which is the resistance of the coating 8 between the solder points 22. In series with the measuring resistance $R_{Mess}$ the thermoelectric potential $U_{MnCu}$ are shown. The thermoelectric potential $U_{MnCu}$ is temperature-dependent and is the result of the different K-values of the resistor element 2 made from Manganin and the contacts 16 made from copper as well as a possible temperature difference. When measuring the voltage across the measuring resistance $R_{Mess}$ with the help of the integrated circuit 12, parasitic effects result through the thermoelectric potential $U_{MnCu}$.

Through the short-circuiting, shown by the broken line, of the voltage $U_{MnCu}$ by the coating 8, these effects are minimised or eliminated.

The resistances $R_{Mn}$ and $R_{Sn}$ are likewise temperature-dependent. This dependency is determined by their temperature coefficients α. In order to compensate this temperature dependency as well, it is proposed that the coating 8 and the resistance piece are selected with corresponding temperature coefficients such that the changes in resistances as a result of temperature are compensated as far as possible.

FIG. 6 shows in a purely illustrative and schematic manner the slope of temperature of the resistance $R_{Mn}$ and the slope of temperature of the resistance $R_{Sn}$. The representation is merely to show how the temperature coefficients of the two resistances are essentially selected such that the temperature-dependent slopes of the two resistances $R_{Mn}$ and $R_{Sn}$ are essentially opposed, so that for a parallel connection of the resistances $R_{Mn}$ and $R_{Sn}$ essentially the overall resistance remains the same.

Through the coating of the resistor element shown, measurement errors as a result of temperature are essentially eliminated or reduced so that the measurement accuracy of a motor vehicle battery sensor element is increased.

The invention claimed is:

1. A motor vehicle battery sensor element comprising:
   a resistor element; and
   at least two spatially separated electrical contacts positioned on the resistor element, wherein the resistor element along with the electrical contacts is coated with a metal coating, such that the thermoelectric potential between the electrical contacts and the resistor element is short-circuited via the coating.

2. The motor vehicle battery sensor element of claim 1, wherein the coating is a tin coating.

3. The motor vehicle battery sensor element of claim 1, wherein the thermoelectric potential between the electrical contacts and the resistor element is between 0.1 μV/K and 1 μV/K.

4. The motor vehicle battery sensor element of claim 1, wherein the coating has a thickness of between 1 μm and 10 μm.

5. The motor vehicle battery sensor element according to claim 1, wherein the resistor element in the temperature range from 20° C. to 50° C. has a temperature coefficient in the range $10^{-6}$ to 10.

6. The motor vehicle battery sensor element of claim 1, wherein the resistor element has a temperature coefficient compensating for the temperature coefficient of the coating such that the effect of the temperature coefficient on the overall resistance is essentially compensated.

7. The motor vehicle battery sensor element according to claim 1, wherein the electrical contacts are made from a non-ferrous metal, in particular copper.

8. The motor vehicle battery sensor element of claim 1, wherein the resistor element is made from two flat parts connected with each other together by a material closure.

9. The motor vehicle battery sensor element of claim 1, wherein a first flat part is a resistance piece in the form of a measuring resistor and a second flat part is a connection piece made from a non-ferrous metal.

10. The motor vehicle battery sensor element of claim 1, wherein the resistor element is at least in part made from one or more of NiCu30Fe, CuMn12Ni, Cu,Ni30Mn, NiFe30, CuNi23Mn, CuMn7Sn, CuNi15, CuNi10, CuMn3, CuNi6, Ni99.6, Ni99.4Fe1 Ni99.98, CuNi2, CuNi1, E-Cu57 and W.

11. The motor vehicle battery sensor element of claim 1, wherein the resistor element is connected with a battery pole clip by a material closure.

12. The motor vehicle battery sensor element of claim 1, wherein the resistor element is connected with a power conductor leading to consumers by a material closure.

13. The motor vehicle battery sensor element of claim 1, wherein the electrical contacts are in the form of flat or round conductors positioned flat on the surface of the resistor element.

14. The motor vehicle battery sensor element of claim 1, wherein the electrical contacts are positioned essentially orthogonally to the direction of the current in the resistor element on the surface of the resistor element.

15. The motor vehicle battery sensor element of claim 1, wherein the ends of the electrical contacts are formed to accommodate an integrated circuit which assesses at least the electrical voltage between the contacts.

16. The motor vehicle battery sensor element of claim 1, wherein the electrical contacts are soldered to the integrated circuit.

17. The motor vehicle battery sensor element of claim 1, wherein the electrical contacts have a spatial distance of 1 mm-50 mm, preferably 5 mm-10 mm.

18. The motor vehicle battery sensor element of claim 1, wherein the electrical contacts are positioned on at least one of
A) in the area of the resistance piece,
B) the transitions between the resistance piece and the connection pieces, and
C) the connection pieces.

19. A method for producing a motor vehicle battery sensor element comprising:
arranging of two spatially separated electrical contacts on a resistor element, electrically connecting of the contacts with the resistor element; and
metal coating of the contacts together with the resistor element, such that the thermoelectric potential between the electrical contacts and the resistor element is short-circuited via the coating.

20. The method of claim 19, further comprising tinning of the electrical contacts together with the resistor element.

21. The method of claim 19, further comprising metal coating of the electrical contacts together with the resistor element by at least one of immersion, galvanization, and powder coating.

* * * * *